US006468878B1

(12) United States Patent
Petruzzello et al.

(10) Patent No.: US 6,468,878 B1
(45) Date of Patent: Oct. 22, 2002

(54) SOI LDMOS STRUCTURE WITH IMPROVED SWITCHING CHARACTERISTICS

(75) Inventors: John Petruzzello, Carmel; Theodore James Letavic, Putnam Valley; Mark Simpson, White Plains, all of NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/794,562

(22) Filed: Feb. 27, 2001

(51) Int. Cl.[7] .................. H01L 21/76; H01L 21/331; H01L 21/8222; H01L 21/00

(52) U.S. Cl. ............... 438/454; 438/311; 438/153; 438/154; 438/163

(58) Field of Search ........................ 438/151, 153, 438/154, 163, 447, 449, 450, 451, 455, 454, 311

(56) References Cited

U.S. PATENT DOCUMENTS

| | | |
|---|---|---|
| 5,246,870 A | 9/1993 | Merchant .................. 437/21 |
| 5,412,241 A | 5/1995 | Merchant .................. 257/409 |
| 5,648,671 A | 7/1997 | Merchant .................. 257/347 |
| 5,969,387 A | 10/1999 | Letavic et al. ............ 257/347 |
| 6,028,337 A | 2/2000 | Letavic et al. ............ 257/347 |

Primary Examiner—Richard Booth
Assistant Examiner—Viktor Simkovic
(74) Attorney, Agent, or Firm—Steven R. Biren

(57) ABSTRACT

An improved method and structure for a transistor device with a lateral drift region and a conducting top field plate is presented. The method consists of decreasing the gate to drain capacitance by means of decreasing the portion of the field plate that is connected to the gate electrode, and hence the effective overlap of the gate with the drift region and drain. This results in decreased energy dissipation in switching the transistor, and more efficient operation. The rate of decrease of the gate to drain capacitance is even faster at higher drain voltages, inuring in significant energy efficiencies in high voltage applications.

13 Claims, 5 Drawing Sheets

SOI LDMOS STRUCTURE WITH IMPROVED SWITCHING CHARACTERISTICS

TECHNICAL FIELD

The present invention involves an improvement in the structure and method for making a semiconductor device of the Silicon-on-Insulator (SOI) type having a lateral drift region and conducting field plate. In particular, the present invention sets forth the structure and technique for making an improved structure in a transistor with a lateral drift region where an extension of the gate electrode, or field plate extending laterally over the field oxide, is utilized, in which the gate to drain capacitance is significantly reduced by maintaining the entire field plate, but reducing the lateral length of the field plate which is connected to the gate.

BACKGROUND OF THE INVENTION

In fabricating high-voltage power devices, tradeoffs and compromises must typically be made in areas such as breakdown voltage, size, "on" resistance, manufacturing simplicity and reliability, and switching cycle times and energy dissipation. Ideally, such devices would feature superior characteristics in all areas, with a minimum of operational drawbacks and fabricational complexities.

Improvements over the basic SOI structure, in which increased breakdown voltages are achieved by providing a linear doping profile in the drift region, are shown in related U.S. Pat. Nos. 5,246,870 and 5,412,241, both commonly assigned with the instant application and incorporated herein by reference. In these SOI devices, the drift region between the channel, or body, and the drain in the lateral MOS structure is provided with various features, such as a thinned portion and a linear lateral doping density profile, which result in substantially increased breakdown voltage characteristics. Additionally, a top field plate is provided over a field oxide of essentially constant thickness to permit twice the conducting charge to be placed in the drift region, thereby reducing conduction losses without reducing breakdown voltage. However, to maintain high breakdown voltage, the total amount of conduction charge near the source side of the drift region must be kept very small, thereby leading to a bottleneck for current flow and preventing optimum reduction in conduction losses.

A further improvement to the basic SOI structure is shown in U.S. Pat. No. 5,648,671, which shows a lateral thin-film SOI device with a linearly-graded field oxide region and a linear doping profile, features which serve to reduce conduction losses without reducing breakdown voltage. A further improvement to that structure is shown in U.S. Pat. No. 5,969,387, commonly assigned with the instant application, and co-invented by two of the present inventors, which is also incorporated herein by reference. The improvement of that patent, whose object is to provide advanced enhanced device performance, discloses a portion of the top oxide layer being increased in thickness in a substantially continuous manner, while a portion of a lateral drift region beneath the top oxide layer, or field oxide layer, being decreased in thickness in a substantially continuous manner, both over a distance which is at least about a a factor of 5 greater than the maximum thickness of the thin semiconductor film.

Yet another improved high-voltage thin-film device is disclosed in U.S. Pat. No. 6,028,337, commonly assigned with the instant application, and co-invented by two of the present inventors, and is incorporated herein by reference as well. This latter improvement provided additional structure within the device for depleting a portion of the drift region adjacent the body region in a lateral direction during operation, in addition to the conventional depletion in the vertical direction which normally occurs in devices of this general type. Theses prior art devices are mentioned by way of example, and there are obviously many other versions of these devices with other improvements and enhancements to the basic SOI LDMOS structure in the prior art.

While disclosing numerous important improvements to the basic SOI LDMOS device, none of the prior art devices deal with the problem of the increased gate to drain capacitance which is a by-product of the top field plate (electrically connected to the gate electrode, and sometimes simply an extension of it) which laterally extends over the field oxide, which itself laterally extends over the drift channel, such top field plate being first introduced in U.S. Pat. Nos. 5,246,870 and 5,412,241, and now commonly part of the standard SOI LDMOS structure. The problem of the resultant increased gate to drain capacitance will be more further described below, and is the concern of the method and structure of the present invention. Its existence directly results in increased gate to drain capacitance, and as a result, increased energy dissipation during transistor switching, and thus energy inefficiency.

Accordingly, it would be desirable to have a transistor device structure capable of high performance in a high-voltage, high current environment, in which operating parameters, in particular lower gate to drain capacitance, and the resulting decreased energy dissipation during switching, are further optimized.

SUMMARY OF THE INVENTION

The present invention seeks to improve upon the above described structures of the prior art by maintaining the benefits of the top field plate, yet, at the same time, reducing the gate to drain capacitance of the device, and thus reducing the energy dissipation during switching. This is effected by a reduction in the overlap of the gate electrode, and the electrically connected field plate, with the drift region of the device. This is accomplished by maintaining the entire top field plate as in the prior art, while severing it from the gate electrode and connecting those portions back to the source, thereby decreasing the gate to drain resistance. Even more benefit is realized by severing the polysilicon gate electrode and connecting the laterally drainward portion to the field plate and leaving only a small sourceward portion of the polysilicon connected to the gate.

In one embodiment, where the top field plate comprises an extended polysilicon gate contact extending partially over the drift region and a metal field plate attached to the gate contact laterally protruding over more of the drift region, the metal field plate attached to the polysilicon gate electrode is severed therefrom and connected back to the source contact. This restricts the gate overlap of the drift region to just the extended polysilicon.

In another, and preferred, embodiment, as summarily described above, the extended polysilicon gate contact itself is severed into two portions. One smaller portion, at the source side of the device, remains connected to the gate electrode and extends over a small portion of the field oxide, and the other larger portion, being connected to the metal field plate, is connected back to the source, restricting the overlap of the gate with the drift region, and thus reducing the gate to drain capacitance, even further.

By utilizing the method of the preferred embodiment, significant reduction in energy dissipation during switching is achieved. The effect increases with the drain voltage and the drain current.

DETAILED DESCRIPTION OF THE PREFERRED EMBODIMENTS

Figure 1:
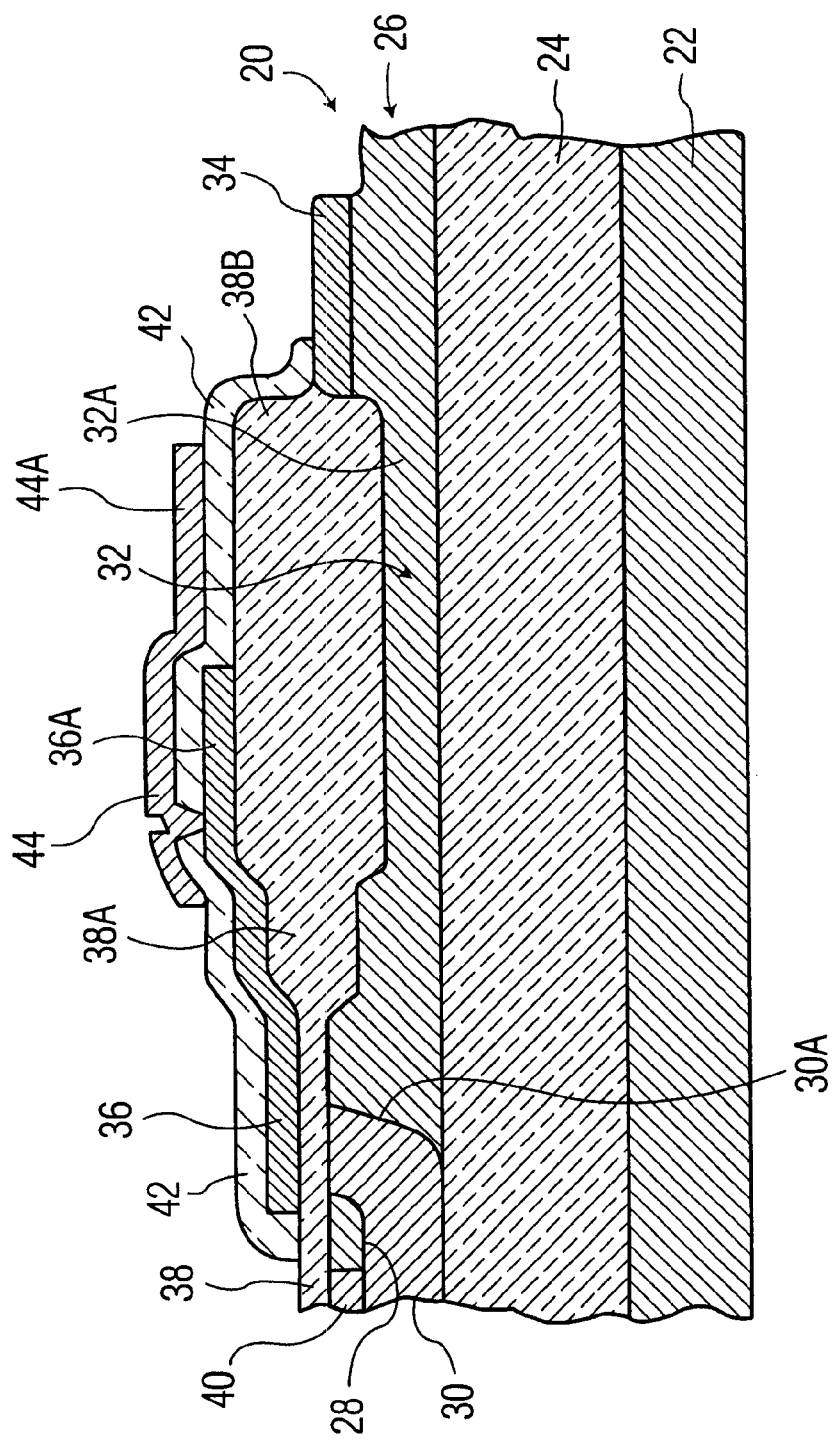
FIG. 1 shows a simplified cross sectional view of a conventional lateral thin-film SOI device.
Figure 2:
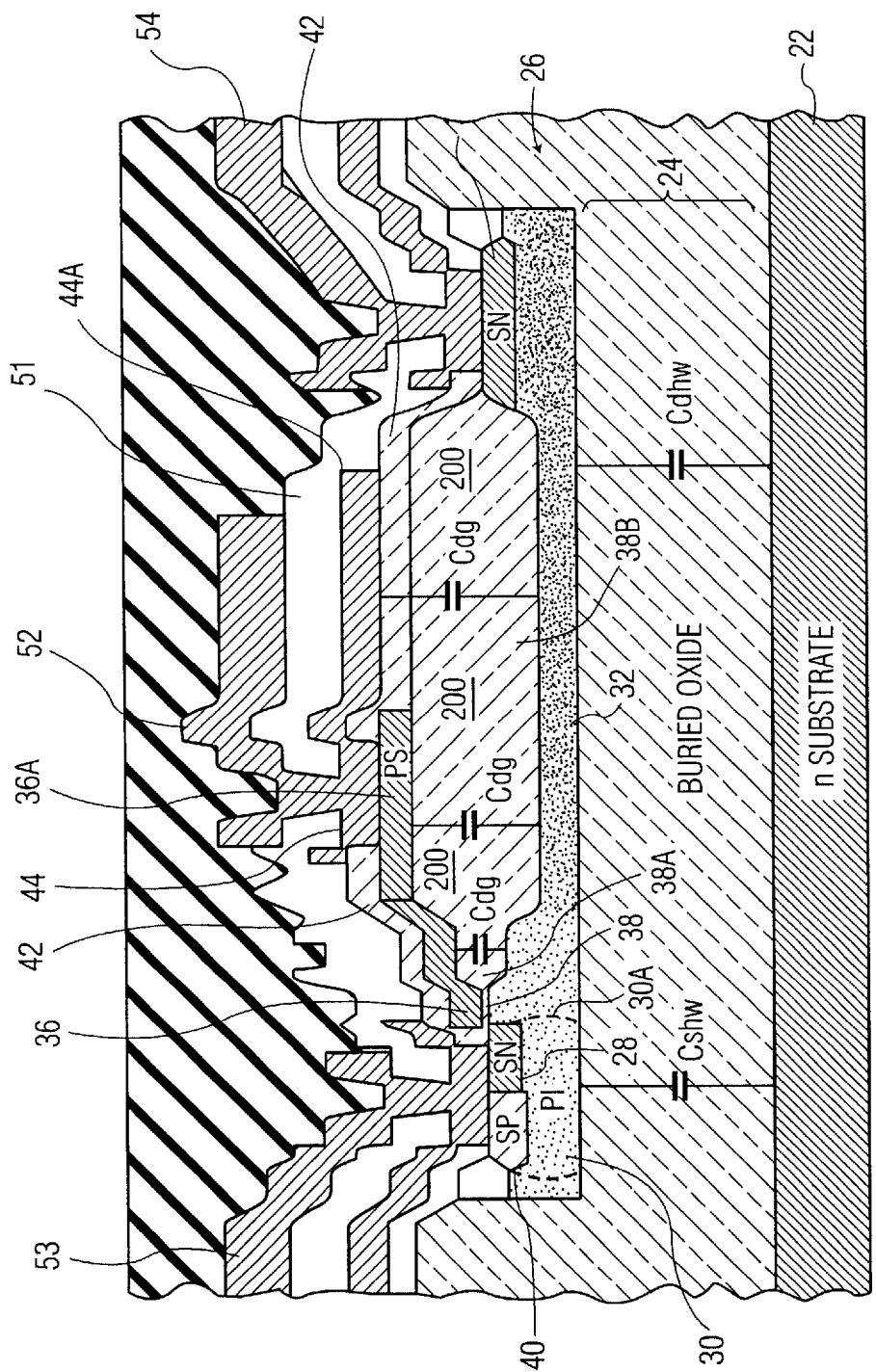
FIG. 2 depicts a more detailed cross sectional view of the conventional lateral thin-film SOI device.

The conventional SOI LDMOS structure as depicted in FIGS. 1 and 2 will now be described, and the preferred embodiments of the present invention, being improvements thereto, will then be described with reference to FIGS. 3 and 4.

In the simplified cross-sectional view of FIG. 1, a lateral thin film SOI MOS transistor 20 includes a semiconductor substrate 22, a buried insulating layer 24, and a semiconductor surface layer 26 in which the device is fabricated. The MOS transistor includes a source region 28 of one conductivity type, a body region 30 of a second, opposite conductivity type, a lateral drift region 32 of the first conductivity type and a drain region 34, also of the first conductivity type. The edge of the body region adjoining the drift region is denoted by reference number 30A. The basic device structure is completed by a gate electrode 36, insulated from the semiconductor surface layer 26 by an oxide insulation region 38. Within the scope of the invention, the MOS transistor structure used in the present invention will preferably have various performance enhancing features such as a stepped oxide region 38A and 38B, an extended gate electrode structure forming a field portion 36A, an insulating oxide layer 42 covering the gate electrode 36 and extended gate electrode 36A, a top field plate 44 made of a metal or equivalently conductive material, an extended portion of the top field plate 44A protruding laterally towards the drain side of the device, and a thinned lateral drift region portion 32A, all as detailed in the aforementioned prior art, as well as numerous and various other performance enhancing features as may be desired, without departing from the spirit or scope of the invention. As well, the MOS transistor 20 may also include a surface contact region 40, in contact with the source region 28, located in the body region 30 and being of the same conductivity type as the body region but more highly doped. It is noted that for use with high voltage applications, where the drain to source voltage is on the order of hundreds of volts, the conducting top field plate is a necessity in order to hold the voltage.

It is understood that the simplified representative devices shown in the Figures herein depict particular device structures, but that wide variations in both device geometry and configuration can be used within the scope of the invention.

FIG. 2 depicts a more detailed version of a very similar conventional SOI LDMOS transistor. Thus regions bearing the same numbers in FIG. 2 as in FIG. 1 represent the same structure elements and will not be further described. FIG. 2 additionally depicts device geometries and configurations in a more accurate fashion, it being understood, however, as explained above, that even more detailed graphic depictions such as FIGS. 2–4 are simplifications of the actual device and not a comprehensive mapping.

Figure 3:
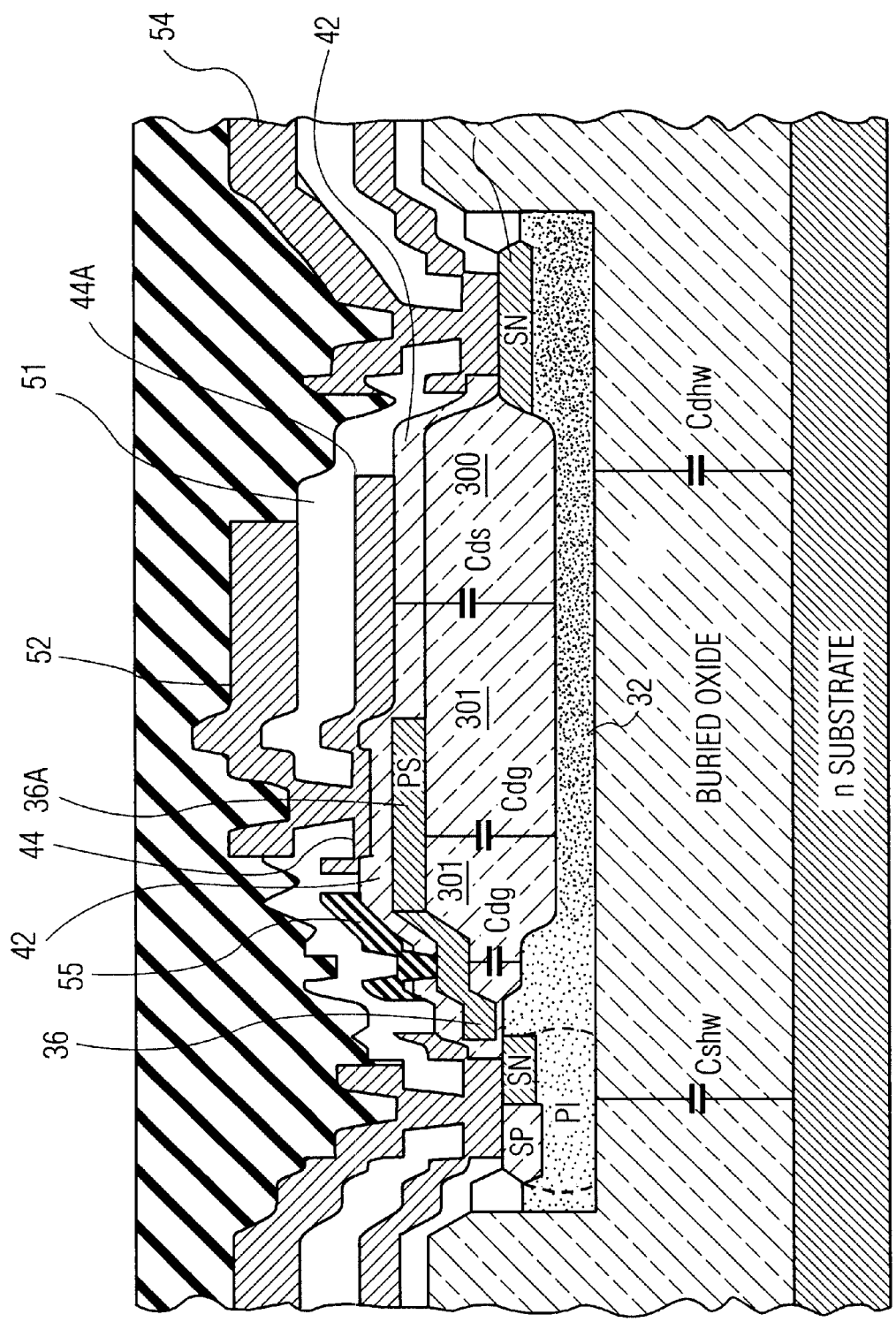
FIG. 3 shows an improvement of the conventional structure of FIG. 2 according to the first embodiment of the present invention.
Figure 4:
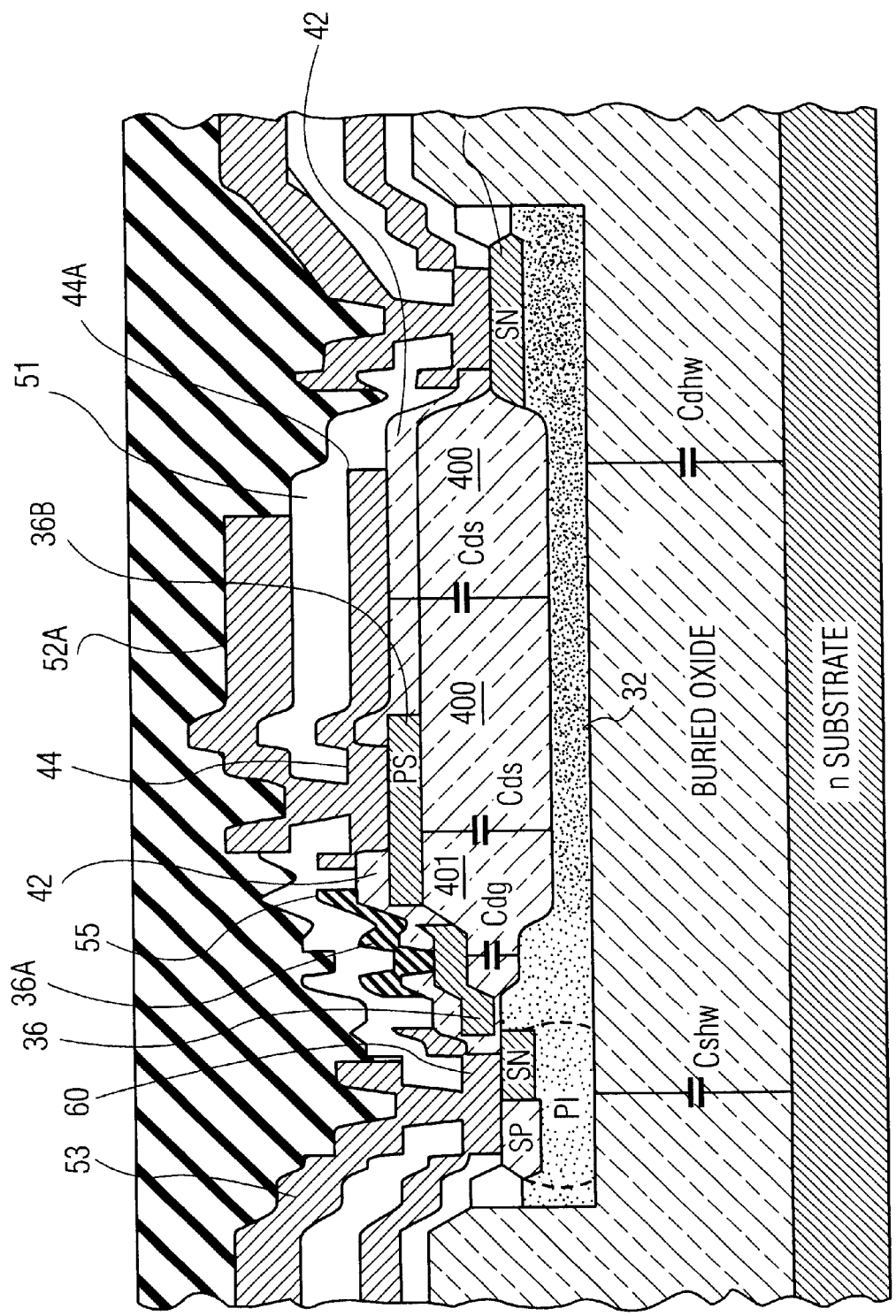
FIG. 4 depicts an improvement of the conventional structure depicted in FIG. 2 according to the second embodiment of the present invention.

With reference to FIGS. 2–4, only structures different, or those appearing as potentially different, from those seen in FIG. 1 will be commented upon, all other device structures and elements in FIGS. 2–4 having the same reference numbers as in FIG. 1 being understood to indicate the same device structures or elements.

FIG. 2 depicts, as an example, an NMOS configuration of the transistor structure. With reference to FIG. 2, there is additionally shown a metal top field plate 44 connected to the extended polysilicon gate electrode structure 36A, an extension of the top field plate 44A, an insulating layer 51 above the top field plate 44, and extended top field plate 44A, and the three metal contacts to the gate 36, source 28, and drain 34 of the device, being items 52, 53 and 54, respectively. It is noted that the use of a second metal layer, as depicted in FIG. 2, in the upper contacts 52, 53 and 54, allows the input impedance at each contact to be low, which is a desirable property as is known in the art.

Additionally, the increase in shading from light to dark of the lateral drift region 32 from the left to the right of the figure, i.e., from the source side to the drain side of the drift region, indicates an increasing doping profile with drainward proximity as is known in the art. Such increased doping may be linear, or some other profile as may be useful in given circumstances and uses, as is known, or may be known, in the art.

Finally, FIG. 2 depicts the capacitance along the field oxide region 38, 38A, 38B between the gate electrode 36, 36A and the drift region 32, denoted as (and equivalent to) the gate to drain capacitance Cdg. As can be seen, this capacitance is directly dependent upon the overlap between the gate electrode and any conductive structures electrically connected to the gate electrode 36 and extended gate electrode 36A, such as the metal field plate 44 and extended field plate 44A. This is commensurate with the general properties of capacitors, where capacitance is proportional to the area of the charge carrying plates, in this case the conducting gate electrode and/or field plate on top, and the drift region on the bottom.

It is well known in the art that when transistors are switched on and off, such as in applications where a series of pulses are required such as, for example, in the driving circuits of fluorescent or gas discharge lamps, energy is dissipated. As is further well known in the art, the dissipated energy is proportional to the gate to drain capacitance. Thus, a convenient method to reduce the dissipated energy in transistor switching is to reduce the gate to drain capacitance.

While the obvious method to decrease the gate to drain capacitance would be to remove the extended gate 36A and metal top field plate 44 and extended top field plate 44A structures, this would defeat the benefits of the top field plate, and its extension, as is known and described in the prior art, such as, for example, in U.S. Pat. No. 5,412,241, and the numerous improvements to the basic SOI structure utilizing a top field plate, extended gate electrode, or the like.

Thus the method and structure of the present invention seek to maintain the voltage holding benefits of the extended gate and field plate structure, while decreasing the gate to drain capacitance, and thus the energy dissipation during switching.

The first embodiment of the present invention will next be described with reference to FIG. 3. FIG. 3 depicts the same device structure as is depicted in FIG. 2 with one exception. The extended polysilicon gate electrode 36A is no longer connected to the top field plate 44. There can be seen, by a comparison of FIGS. 2 and 3, that the metal field plate 44, and thus the extension of same 44A, in FIG. 2 have been severed from the extended polysilicon gate electrode 36A. The top field plate 44 and extension 44A have been connected to the source, in a connection not shown. The external contact 52 in FIG. 2, which was formally the external contact to the gate electrode, is in the first embodiment no longer connected to the gate and therefore a new structure 55 serves as the metal contact to the gate electrode (external contact not shown).

As a result of these changes, according to the first embodiment of the invention, the overlap of the gate with the drift region has been decreased significantly. As a result the gate to drain capacitance has also been decreased as a result. With reference to FIG. 3, the gate to drain capacitance, which formally existed across the drain side, or right side in FIG. 3, of the field oxide has now been replaced with a drain to source capacitance Cds 300. On the left side of the field oxide, or the source side, the gate to drain capacitance remains and is depicted in FIG. 3 as item 301. As a result of this reduction in gate to drain overlap and the corresponding reduction in gate to drain capacitance, the energy dissipation during switching of the transistor structure depicted in FIG. 3, being the first embodiment of the present invention, is significant, as will be described more quantitatively below.

The second embodiment of the present invention will next be described with reference to FIG. 4. FIG. 4 is identical to FIG. 3 except for one minor change. In FIG. 3, the polysilicon gate electrode is one continuous structure 36, 36A, extending from the source region rightward in FIG. 3, or drainward, laterally along the device field oxide. In FIG. 4, it can be seen that the larger portion of the polysilicon gate electrode 36B (note that the structure designated 36A in FIG. 3 is divided into two sections in FIG. 4, now labeled 36A (still connected to the gate) and 36B (severed from the gate) in FIG. 4) has been severed from electrical connection with the gate and is now reconnected to the top field plate 44 as it was in the device depicted in FIG. 2. The new metal gate contact 55 which sits on top of the remaining polysilicon gate electrode is still present because it is still necessary to electrically connect the gate externally through this contact, inasmuch as the top field plate 44 and the metal connector 52A disposed above the top field plate, are only connected to the severed portion of the polysilicon field gate 36B and are not electrically connected to the gate.

As in the first embodiment of the present invention as shown in FIG. 3, the field plate 44, the external connector to the contact of the field plate 52A and the polysilicon extension 36B (now severed from the gate), are connected back to the source contact, and again, this connection is not shown. It is noted that the use of the second metal layer, and thus the creation of the upper contacts 52, 53 and 54, facilitates the connection of the field plate 52A (now renamed because it is no longer an external gate contact) back to the source external contact 53 by allowing the input impedance at each contact to be low, and by precluding the need to break the lower metal layer to connect the top field plate 44 with the lower source contact 60.

As a result of this modification, the gate to drain capacitance has been restricted to the left most, or sourceward, portion of the field oxide and most of the field oxide carries a drain to source capacitance denoted as Cds 400 in FIG. 4 which appears between the top field plate extension 44A, and the drift region 32, as well as between the now severed polysilicon field plate 36B and the drift region 32. The benefit from this modification results in an even greater decrease in energy dissipation experienced during transistor switching as a result of the now significantly diminished gate to drain capacitance Cdg 401. The second embodiment is the preferred embodiment for these reasons.

Figure 5:
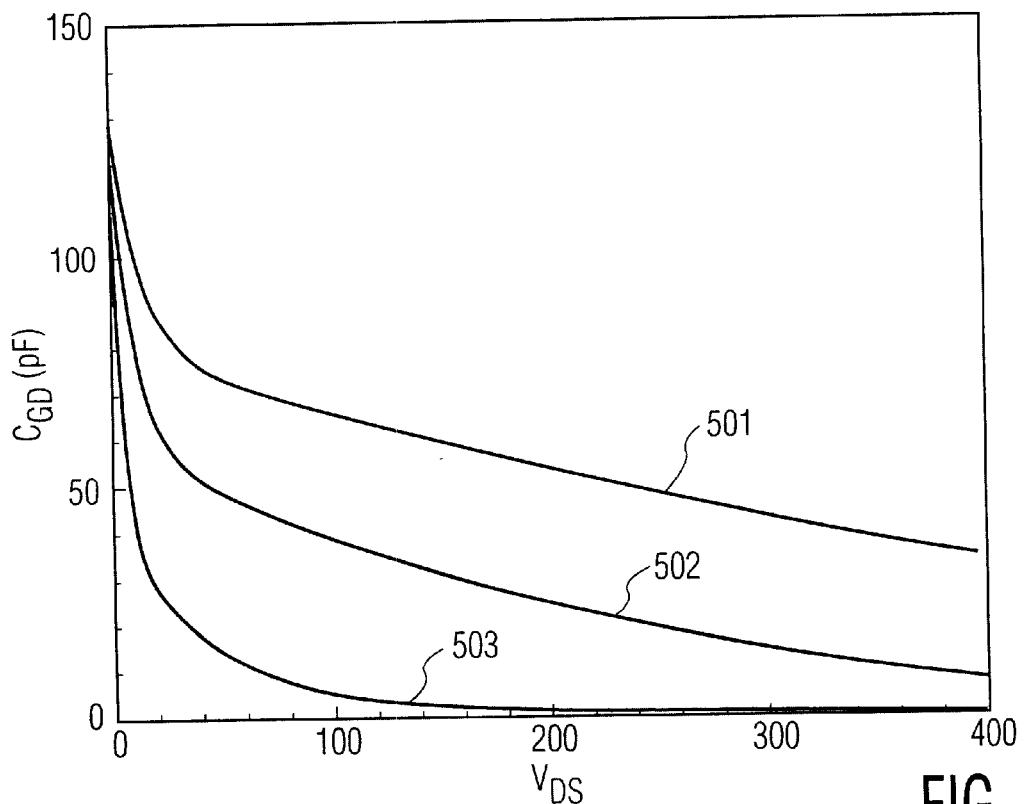
FIG. 5 is a plot of the gate to drain capacitance, or $C_{GD}$, versus the drain to source voltage $V_{DS}$, for the prior art conventional structure and the structures of the preferred embodiments of the present invention.

The change in gate-to-drain capacitance Cdg, measured in pico Farads, is plotted against the drain-to-source voltage, $V_{DS}$, in FIG. 5. FIG. 5 is plotted on the linear scale, and as can be seen there is significant difference in capacitance between the three plots. Plot 501 refers to the structure depicted in FIG. 2, which is the conventional SOI LMDOS transistor structure. As can be seen, while the gate to drain capacitance does decrease with $V_{DS}$, it still maintains a rather high value for high $V_{DS}$. Plot 502 relates to the transistor structure depicted in FIG. 3, being the first embodiment of the present invention, which, at high $V_{DS}$, significantly reduces the gate to drain capacitance. Finally, plot 503, which relates to the transistor device structure depicted in FIG. 4, being the second, and preferred, embodiment of the invention, for $V_{DS}$ greater than 100 volts, effectively brings the gate to drain capacitance to a miniscule value, and results in significant effect upon the operation of the device in terms of energy dissipation.

As can be seen in FIG. 5, the gate to drain capacitance not only decreases with drain voltage in plots 502 and 503, but the rate of decrease with respect to drain voltage, increases the as drain voltage is increased. Thus, in the operation of the transistor structure depicted in FIGS. 3 and 4 at high drain voltages, the decrease in gate to drain capacitance is significant, providing an important benefit at high voltage switching operations.

Figure 6:
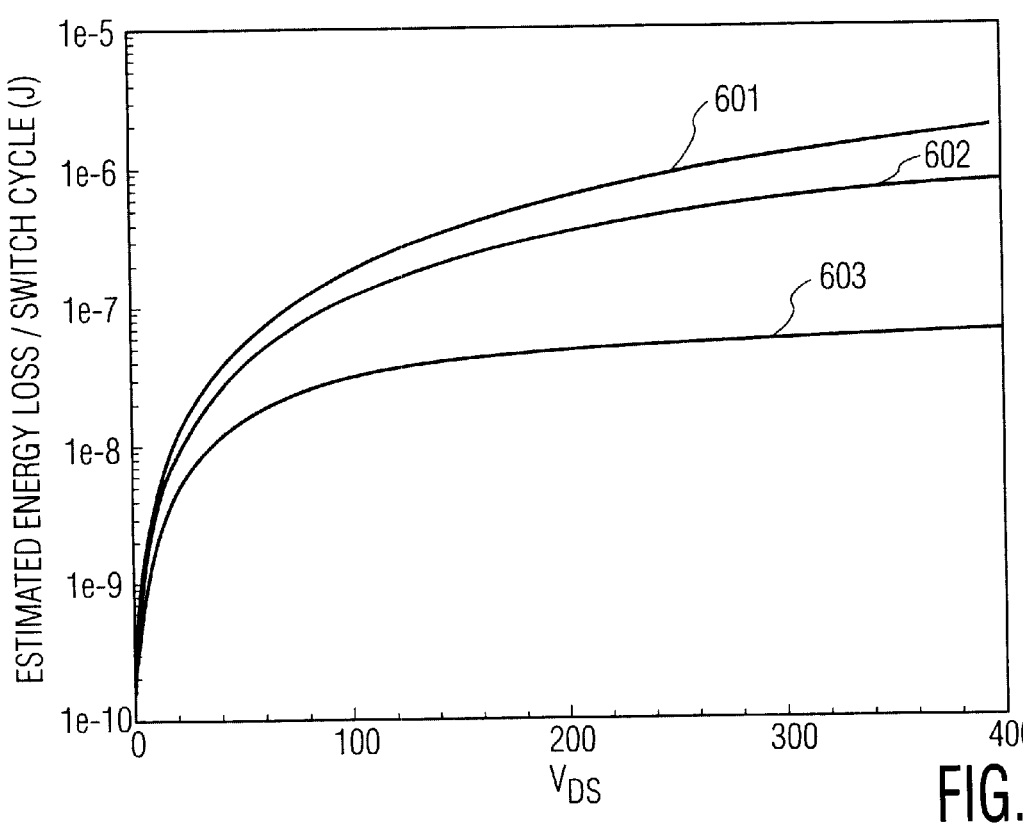
FIG. 6 is a plot of the estimated energy loss per switching cycle as a function of $V_{DS}$, for the prior art conventional structure and the structures of the preferred embodiments of the present invention.

A graphic illustration comparing the energy dissipation per switching cycle of the transistors depicted in FIGS. 2–4 is presented in FIG. 6. Plot 601 is the estimated energy loss per switching cycle of the transistor structure presented in FIG. 2, which is the conventional SOI LDMOS structure. As can be seen therein, with increase in $V_{DS}$ the energy dissipation continues to increase. Plot 602 refers to the structure depicted in FIG. 3, which is the first embodiment of the present invention, which limits the estimated energy loss per switching cycle. Finally, plot 603 is the estimated energy loss per switching cycle measured on the transistor device depicted in FIG. 4, being the second embodiment of the invention, wherein a significant decrease in the energy loss is seen and a rather flat plot characteristic appears such that the energy loss does not increase at a very great rate as $V_{DS}$ is increased. Note that the plots depicted in FIG. 6 are on a log scale such that the apparent small difference between plots 601 and 602 is significantly greater than it appears and the energy savings realized with the structure depicted in FIG. 4, shown as plot 603, is materially significant.

As can be seen from FIG. 6, the dissipated energy is approximately 25 times lower for the preferred second embodiment device as compared with the conventional SOI LMDOS structure depicted in FIG. 2. This is why the preferred embodiment of the invention is the split poly structure, depicted in FIG. 4. Unless capacitance of some quantity, or a lower source to drain capacitance than is possible with the structure of FIG. 4, is a desired property in a particular application, the almost complete removal of gate to drain capacitance achieved by the split poly structure will be the device structure of choice.

In order to present these results in yet another manner, so as to fully and clearly described the benefits of the first and second embodiments of the present invention, the following Table A is a listing of the energy loss, in micro Joules, versus drain current, in Amperes, for each of the three structures depicted in FIGS. 2–4.

TABLE A

| DRAIN CURRENT, ID (A) | Energy Loss (micro Joules) per Switching Cycle | | |
|---|---|---|---|
| | CONVENTIONAL SOI LDMOS | FIRST EMBODIMENT | SECOND EMBODIMENT |
| 5.4 | 48 | 26 | 13 |
| 1.6 | 18 | 12 | 9.6 |
| 0.6 | 10.8 | 9.6 | 8.8 |

In Table A, measurements were performed at three drain current levels (ID column) with Vdrain=400V and Vgate=10V. The next three columns contain the energy loss per cycle (turn on and off) for each of the three transistor structures at each of the three measured drain currents.

The devices for this test were designed for a maximum current rating of 6A, and at this current the split poly design of the second embodiment is a factor of 4 better than the conventional device and twice as good as the first embodiment device. The difference in energy loss becomes smaller as one moves to lower currents, but still shows some improvement for large drain currents.

While the foregoing describes the first embodiment and the preferred embodiment of the invention, it is understood by those of skill in the art that innumerable various modifications and variations may be utilized, and the extension of the structure of the first embodiment and the second, preferred, embodiment to any number of transistor structures, in particular, for example, those structures where there is significant gate to drain capacitance resulting from the overlap between a laterally extended gate and/or top field plate electrically connected thereto, and the lateral drift or drain regions. Thus LIGBTs, for example, with all the variations and enhancements known and to be known, and the like would also greatly benefit from the method and structure of the present invention. Such innumerable possible modifications are intended to be covered by the following claims.

What is claimed:

1. A method of decreasing the energy dissipation in switching a transistor with a lateral drift region, a laterally extended gate electrode over a portion of said lateral drift region, and a conducting field plate laterally extended over at least a portion of said lateral drift region, comprising:

severing the extended gate portion into two portions;

isolating electrically a first portion of the extended gate electrode from the field plate and the second portion; and connecting the field plate and the second portion of the extended gate electrode to the source so as to decrease the gate to drain capacitance.

2. The method of claim 1 where the gate electrode and the field plate at least to some extent extend over different portions of the drift region.

3. The method of claim 2, where the transistor's lateral drift region is laterally disposed between a body region and a drain region.

4. The method of claim 3 where the extended gate electrode is made of polysilicon, and the field plate of metal.

5. The method of claim 4 where the first portion of the extended gate electrode is laterally nearest the source and the second laterally nearest the drain.

6. The method of claim 5 where the transistor is any one of an NMOS or PMOS device.

7. The method of claim 5 where the transistor is an LIGB device.

8. A method of decreasing the energy dissipation in switching a transistor with a lateral drift region, a laterally extended gate electrode over at least a portion of said lateral drift region, and a conducting field plate laterally aextended over at least a portion of said lateral drift region, comprising:

isolating electrically the extended gate electrode from the field plate; and connecting the field plate to the source so as to decrease the gate to drain capacitance.

9. The method of claim 8 where the gate electrode and the field plate at least to some extent extend over different portions of the drift region.

10. The method of claim 9, where the transistor's lateral drift region is laterally disposed between a body region and a drain region.

11. The method of claim 10 where the extended gate electrode is made of polysilicon, and the field plate of metal.

12. The method of claim 11 where the transistor is any one of an NMOS or PMOS device.

13. The method of claim 11 where the transistor is an LIGBT device.

* * * * *